United States Patent
Wang et al.

(10) Patent No.: US 8,473,877 B2
(45) Date of Patent: Jun. 25, 2013

(54) STRIPING METHODOLOGY FOR MASKLESS LITHOGRAPHY

(75) Inventors: Hung-Chun Wang, Ching-Suei (TW); Tzu-Chin Lin, Hsinchu (TW); Nian-Fuh Cheng, Hsinchu (TW); Jeng-Horng Chen, Hsin-Chu (TW); Wen-Chun Huang, Tainan (TW); Ru-Gun Liu, Hsinchu (TW)

(73) Assignees: Taiwan Semiconductor Manufacturing Company, Ltd.; Haynes and Boone, LLP

(*) Notice: Subject to any disclaimer, the term of this patent is extended or adjusted under 35 U.S.C. 154(b) by 0 days.

(21) Appl. No.: 13/225,617

(22) Filed: Sep. 6, 2011

(65) Prior Publication Data

US 2013/0061187 A1 Mar. 7, 2013

(51) Int. Cl.
*G06F 17/50* (2006.01)

(52) U.S. Cl.
USPC .............................................. 716/55; 716/124

(58) Field of Classification Search
USPC .................................................... 716/55, 124
See application file for complete search history.

(56) References Cited

U.S. PATENT DOCUMENTS

| 5,533,170 | A * | 7/1996 | Teitzel et al. ................... 358/1.8 |
| 6,341,007 | B1 | 1/2002 | Nishi et al. |
| 6,498,685 | B1 | 12/2002 | Johnson |
| 6,717,097 | B1 * | 4/2004 | Sandstrom et al. ........ 219/121.6 |
| 7,795,601 | B2 | 9/2010 | Lin et al. |
| 7,851,774 | B2 | 12/2010 | Lin et al. |
| 2005/0102723 | A1 | 5/2005 | Van Den Nieuwelaar et al. |
| 2006/0055903 | A1 * | 3/2006 | Thuren et al. ................... 355/53 |
| 2007/0278424 | A1 | 12/2007 | Lin et al. |
| 2010/0248158 | A1 * | 9/2010 | Chen et al. ................... 430/322 |
| 2012/0221981 | A1 * | 8/2012 | Fujimura et al. ................ 716/53 |
| 2012/0237877 | A1 * | 9/2012 | Wang et al. ................... 430/296 |

OTHER PUBLICATIONS

Unpublished U.S. Appl. No. 12/411,229, filed Mar. 25, 2009 entitled "High Volume Manufacturing Massive E-Beam Maskless Lithography System", 26 pages.
Unpublished U.S. Appl. No. 13/217,345, filed Aug. 25, 2011 entitled "Geometric Pattern Data Quality Verification for Maskless Lithography", 27 pages.
Chen, Jack J. H., et al., "Multiple electron beam maskless lithography for high-volume manufacturing," Taiwan Semiconductor Manufacturing Company, Ltd., 3 pages, Sep. 2011.
Chen, Jack J. H., et al., "Multiple electron beam maskless lithography for high-volume manufacturing," Taiwan Semiconductor Manufacturing Company, Ltd., Apr. 28, 2009, 3 pages.

* cited by examiner

*Primary Examiner* — Thuan Do
*Assistant Examiner* — Magid Dimyan
(74) *Attorney, Agent, or Firm* — Haynes and Boone, LLP

(57) ABSTRACT

The present disclosure involves a method of performing a maskless lithography process. The method includes receiving a computer layout file for an integrated circuit (IC) device. The layout file contains a plurality of IC sections. The method includes separating the computer layout file into a plurality of sub-files. The method includes striping the plurality of sub-files concurrently using a plurality of computer processors, thereby generating a plurality of striped sub-files. The method includes transferring the plurality of striped sub-files to a maskless lithography system.

20 Claims, 14 Drawing Sheets

STRIPING METHODOLOGY FOR MASKLESS LITHOGRAPHY

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To achieve greater functional density and miniature geometry sizes for semiconductor devices, various advanced lithography techniques have been proposed and implemented. Among these advanced lithography techniques is maskless lithography, which does not require a photomask to perform a lithography process. For example, in an electron beam lithography process, beams of electrons are emitted in a patterned fashion on a resist material to expose and develop the resist material into a patterned resist mask. The patterned resist mask can then be used to pattern the various layers of a substrate below.

Maskless lithography offers advantages such as enhanced lithography resolution and patterning precision. However, existing maskless lithography processes also have drawbacks such as long processing time and low throughput. Therefore, while existing maskless lithography processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
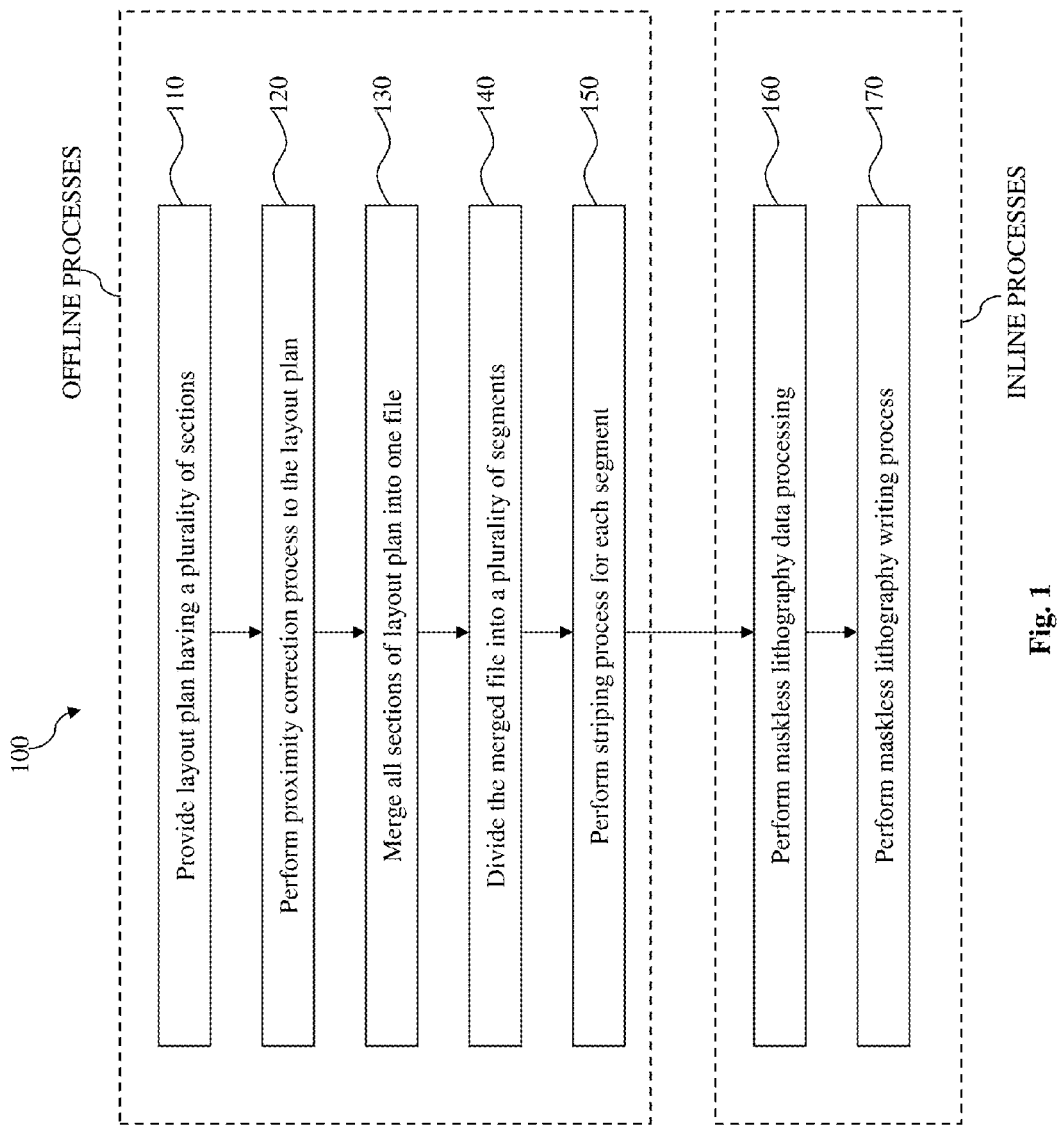
FIG. 1 is a flowchart illustrating a method of fabricating a semiconductor device according to one embodiment of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As semiconductor fabrication technologies continue to evolve, maskless lithography processes have been utilized to achieve increasing functional densities and decreasing device sizes. One form of maskless lithography is electron beam lithography. In electron beam lithography, an electron beam apparatus emits beams of electrons in a patterned manner across a surface of a substrate covered with a resist film. This process may be referred to as an exposure process. The electron beam apparatus also selectively removes either exposed regions or non-exposed regions of the resist film. This process may be referred to as a developing process. The developing of the resist film results in a patterned resist film, which may be used as a patterned mask to pattern the substrate therebelow in subsequent fabrication processes.

Maskless lithography techniques overcome the diffraction limit of light, which has been a bottleneck for traditional photolithography processes. Consequently, maskless lithography may offer benefits such as enhanced resolution and increased precision compared to traditional photolithography processes. However, maskless lithography processes may have certain drawbacks such as long processing time and low throughput. These drawbacks have impeded the adoption of maskless lithography in mainstream high volume semiconductor fabrication. The present disclosure offers various methods and techniques to improve the speed of maskless lithography, which are discussed below with reference to FIGS. 1-10.

According to an embodiment of the present disclosure, a maskless fabrication method 100 is illustrated as a flowchart in FIG. 1. The method 100 includes blocks 110-170, each of which is discussed below in more detail. In block 110, a layout plan or layout design is provided for an integrated circuit (IC). The IC layout plan may contain a plurality of semiconductor features. The IC layout plan may be generated as a computer file, for example as a Graphic Database System (GDS) type file or as an Open Artwork System Interchange Standard (OASIS) type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools.

Figure 2:
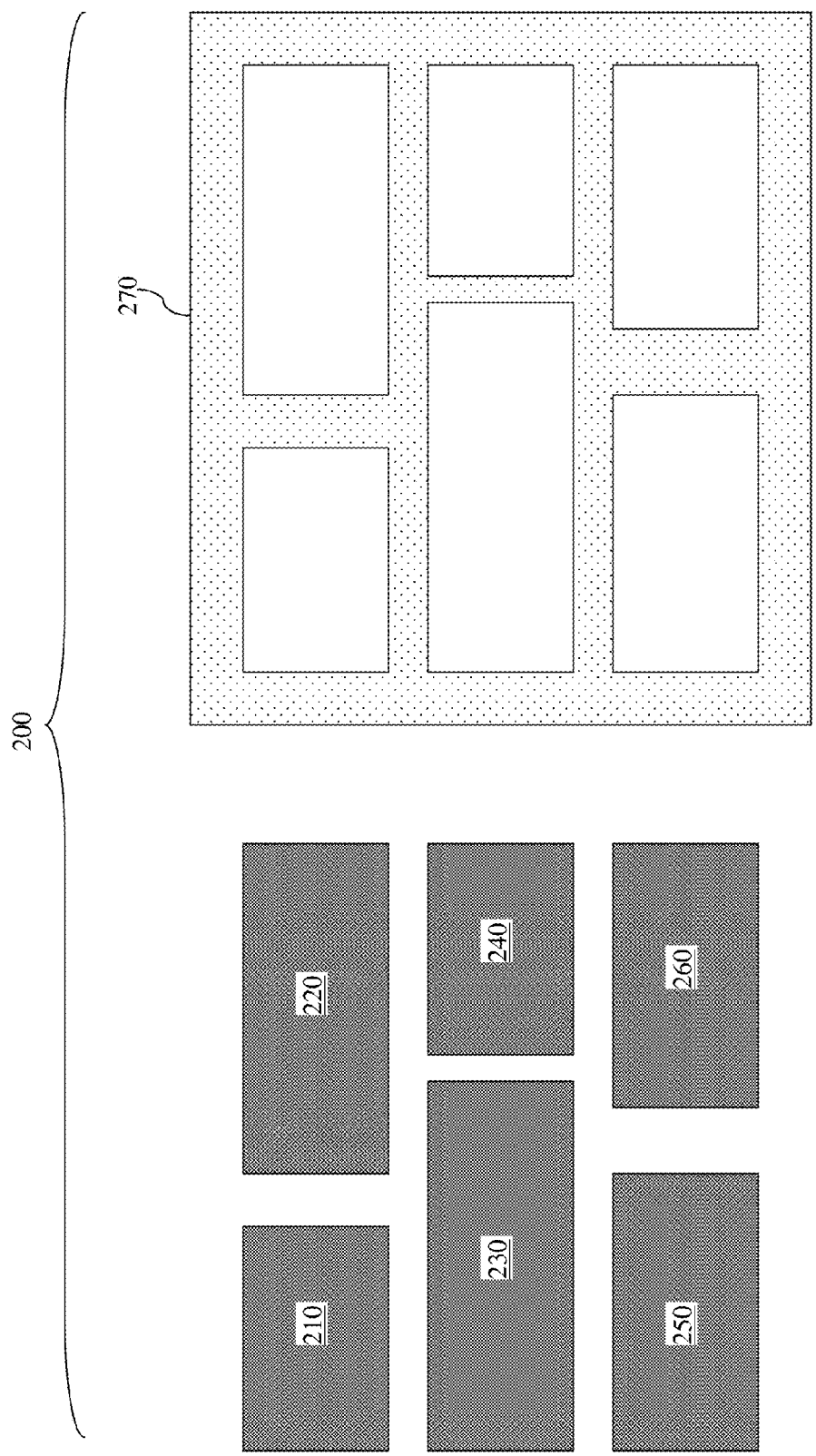
FIGS. 2-5 illustrate an integrated circuit (IC) layout plan at various stages of processing according to the embodiment of FIG. 1.

For the sake of providing an example, a simplified IC layout plan 200 is illustrated in FIG. 2. The IC layout plan 200 includes a plurality of circuit sections or blocks 210-270. In the illustrated embodiment, the sections 210-260 are different logic blocks, and the section 270 is a frame inside which the logic blocks 210-260 reside. It is understood that the circuit sections 210-260 may have varying sizes. The sizes may refer to physical dimensions of the circuit sections 210-260 or the amount of data contained within each section. For example, as shown in FIG. 2, the sections 220 and 230 may have greater sizes than the other sections.

Referring back to FIG. 1, the method 100 includes block 120, in which a proximity correction process is performed to the IC layout plan generated in block 110. The proximity correction process is a lithography enhancement technique that can be used to compensate for image errors due to process defects. For example, electron scattering during the performance of a maskless lithography process may adversely impact regions of the substrate near the region that is being exposed by the electron beams. Consequently, these nearby regions may become inadvertently exposed, thereby causing variations of the desired exposure pattern. To compensate for these image errors, proximity correction techniques such as dose modification, shape modification, or background correction exposure may be employed in a maskless lithography process. The performance of the proximity correction process in block 120 helps make the fabricated semiconductor feature patterns resemble the desired patterns more accurately.

Figure 3:
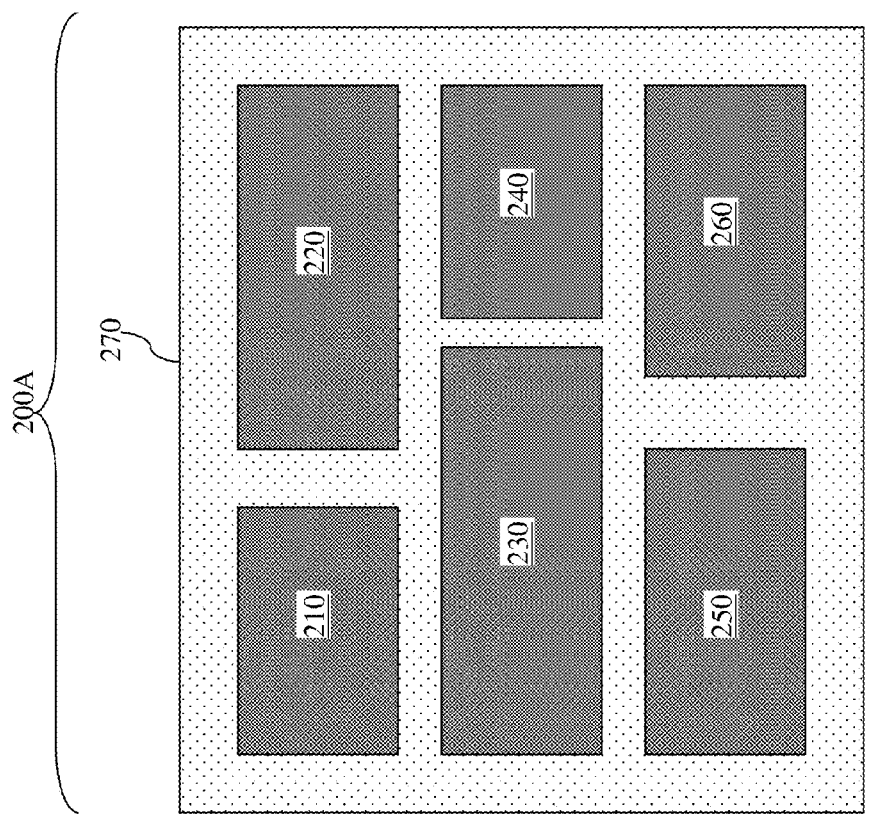

The method 100 includes block 130, in which all the sections of the layout plan is merged into one file. This is illustrated in FIG. 3, as the individual circuit sections 210-260 are combined with the frame 270 into a single merged file 200A. For conventional maskless lithography processes, the merged file then undergoes a striping process (described in more detail below). However, the merged file 200A may be relatively large in size, as it may contain a significant amount of data. As such, the striping process may take a long time to perform. This lengthens cycle time and drives up fabrication costs. Furthermore, special processing hardware may be required to handle the large amount of data in the striping process. For example, a computer server with a large amount of memory may be required as part of the processing hardware. Such hardware can be expensive, thereby further increasing fabrication costs.

Figure 4:
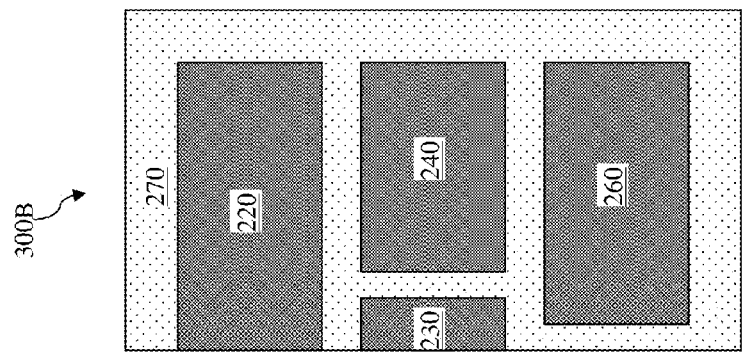
Figure 4:
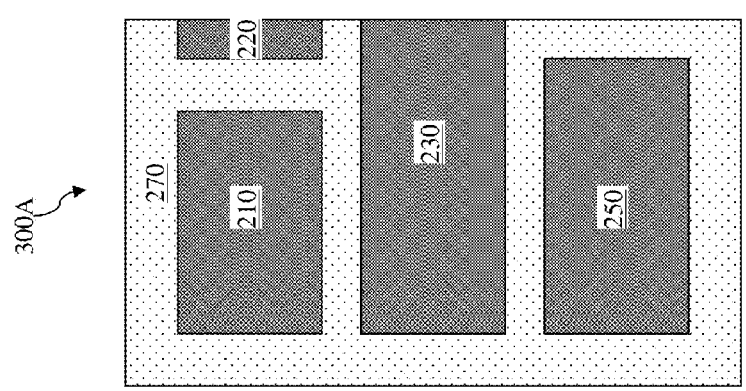

Referring back to FIG. 1, to avoid these problems discussed above, the method 100 includes block 140 to perform a division process on the merged file. This is illustrated in FIG. 4, in which the merged file 200A (FIG. 3) containing the circuit sections 210-270 is divided or partitioned into two segments 300A and 300B. The segment 300A contains the circuit sections 210 and 250, and portions of the circuit sections 220 and 230. The segment 300B contains the circuit sections 240 and 260, and portions of the circuit sections 220 and 230. Since the segments 300A-300B each contain only a portion of the merged file 200A (and therefore only a portion of its data), the segments 300A-300B have smaller sizes than the merged 200A. Hence, the segments 300A-300B are easier to process and may not require special processing hardware.

It is understood that the division process of block 140 of FIG. 1 may be performed in a non-random manner. That is, the division process may be performed according to a set of predefined optimization criteria. The optimization criteria may include a pattern distribution density profile of the IC chip corresponding to the merged file 200A. For example, some regions of the IC chip may have greater pattern densities (more semiconductor feature patterns per unit area) than other regions of the chip. Pattern density of a region is correlated with the amount of data contained within the region. Thus, IC regions with greater pattern densities may be larger in data size than the regions with a lower pattern density. The division process may be performed to take these pattern densities into consideration. For example, if the left side of the IC chip has a greater pattern density than the right side, then the division process may be performed in a manner such that the segment 300A (left side of the chip) has a smaller area than the segment 300B (right side of the chip).

Another example of the optimization criteria includes sizes of the individual IC sections 210-270. The division process may be performed so as to take the sizes of the IC sections into account as well, in a manner similar to that described above with reference to the pattern densities. It is understood that other suitable optimization criteria exist, but they are not discussed herein for the sake of simplicity.

Figure 5:
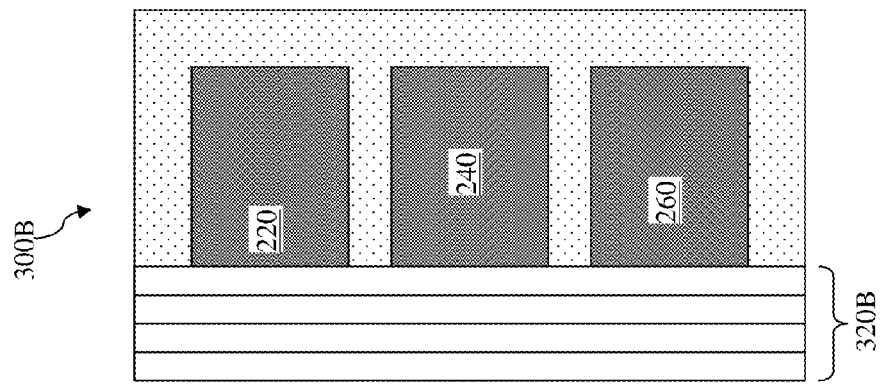
Figure 5:
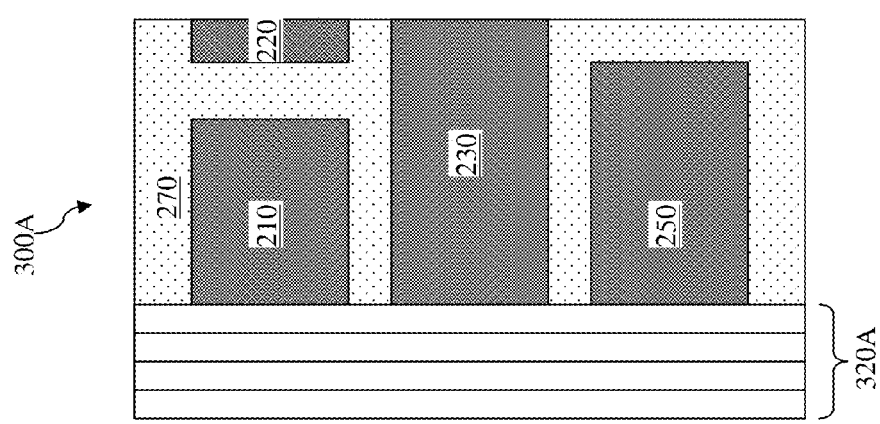

Referring back to FIG. 1, the method 100 contains block 150, in which a striping process is performed for each of the divided segments. The striping process is illustrated in FIG. 5, which shows the segments 300A and 300B each being striped by a plurality of stripes 320A and 320B, respectively. In an embodiment, the stripes 320A-320B correspond to arrays of radiation energy beams, for example electron beams, that may be emitted in a later lithography process. Each of the stripes may have a width (measured horizontally in FIG. 5) of a few microns. The length (measured vertically in FIG. 5) of the stripes may span or extend substantially across the entire IC chip, i.e., from the bottom side to the top side of the IC chip.

In an embodiment, the striping process is performed in a distributed manner. For example, the striping process for the segment 300A is performed by one computer processing tool such as a computer server, whereas the striping process for the segment 300B is performed by a different computer processing tool. These striping processes may be performed concurrently. In other words, the computer server responsible for striping the segment 300A may be running simultaneously as the computer server responsible for striping the segment 300B.

The distribution of the striping task reduces the processing load placed on each individual server, since each server is now handling only a portion of the data associated with the overall merged file. The multiple computer servers running in parallel with one another can significantly reduce the striping processing time, thereby increasing the speed of fabrication and reducing the cost of fabrication. Furthermore, the computer servers no longer need a large amount of memory to handle the smaller data sizes. Thus, less expensive computer servers may be utilized to carry out the striping task discussed above. It is understood that the segments 300A and 300B may each be striped entirely, but for the sake of simplicity and clarity, the segments 300A and 300B are shown to be partially striped herein.

Referring back to FIG. 1, the blocks 110-150 of the method may be considered offline processes. That is, the blocks 110-150 are performed by fabrication tools that are not a part of the maskless lithography tool itself. For example, the blocks 110-150 may be performed by one or more computer servers running computer software instructions. After the execution of block 150 is completed, the data (corresponding to striped segments of the layout plan) are transferred to a maskless lithography tool or system. In an embodiment, the maskless lithography tool or system includes an electron beam lithography apparatus, the details of which will be described in more detail below with reference to FIGS. 11-13. The maskless lithography apparatus performs blocks 160 and 170 of the method 100, and as such the blocks 160 and 170 may be referred to as inline processes. It is understood that the division of the overall layout plan into individual portions may also reduce a data transfer bandwidth, since the data can now be transferred in smaller chunks.

In block 160, maskless lithography data processing is performed on the received file. In an embodiment, the maskless lithography process includes snapping, dithering, and/or beam correction processes. Thereafter, a maskless lithography writing process is performed in block 170. The maskless lithography writing process may include an electron beam process, in which arrays of electron beams are used to write image patterns to a substrate or wafer according to the striped layout files generated by the offline processes (and processed by the block 160).

Figure 6:
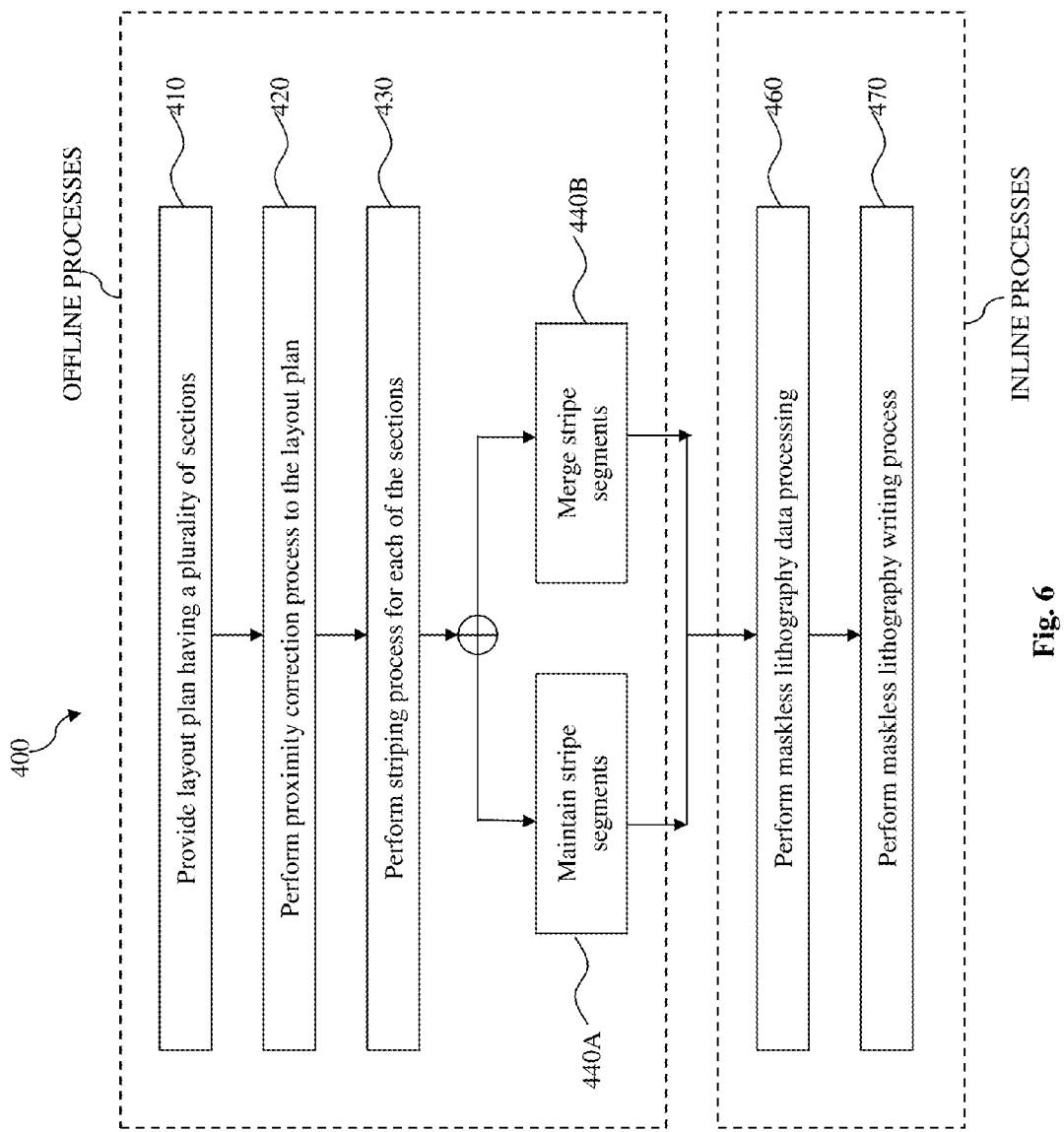
FIG. 6 is a flowchart illustrating a method of fabricating a semiconductor device according to an alternative embodiment of the present disclosure.

FIG. 6 is a maskless fabrication method 400 shown as a flowchart according to an alternative embodiment of the present disclosure. The method 400 includes blocks 410-470, the details of which are discussed below. In block 410, an IC layout plan is provided for an IC. For the sake of simplicity, the layout plan of FIG. 2 is used to illustrate the layout plan associated with block 410. The block 410 is substantially similar to the block 110 of FIG. 1, therefore the details of its execution are not discussed herein for the sake of simplicity.

The method 400 also includes block 420 in which a proximity correction process is performed to the layout plan. The block 420 is substantially similar to the block 120 of FIG. 1, therefore the details of its execution are not discussed herein.

Figure 7:
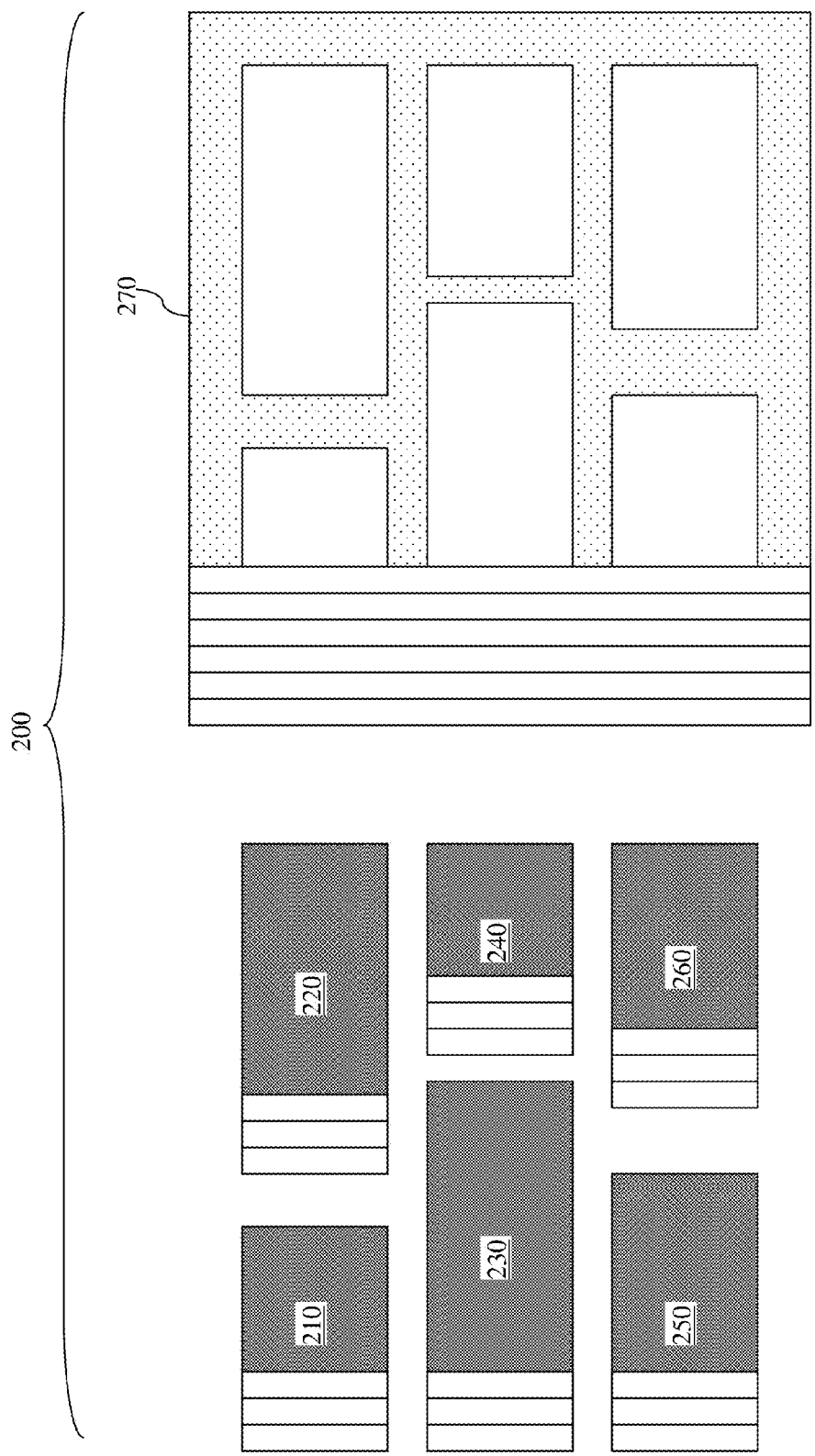
FIG. 7 illustrates an IC layout plan at a stage of processing according to the embodiment of FIG. 6.

The method 400 includes block 430 in which a striping process is performed for each of the sections of the layout plan. This is illustrated in FIG. 7, where the logic blocks 210-260 and the frame 270 each undergo a striping process. The striping process is similar to that discussed above with reference to FIG. 5. In an embodiment, the striping process for each of these circuit sections 210-270 is handled by a different one of a plurality of data processing units or computer servers. Similar to the embodiment illustrated in FIG. 5, these computer servers work in parallel to execute the striping processes concurrently. In other words, the striping process of block 430 in FIG. 6 is a distributed process. Therefore, the striping process of block 430 also derives benefits such as shortened cycle time, less demand on the computer servers, and reduced fabrication costs.

The method 400 then either undergoes block 440A or block 440B. In block 440A, the stripe segments of each of the circuit sections 210-270 are maintained. Thus, no merging process is performed. In block 440B, the stripe segments of the circuit sections 210-270 are merged by stripe order of each beam. In more detail, each stripe segment may contain reticle field layout information in a file name, a file header, or a lookup table. A plurality of vertically-aligned stripe segments may be merged into a single stripe.

The blocks 440A and 440B represent two different embodiments, one of which maintains the stripe segments (instead of merging them), and the other of which merges the stripe segments before the data is sent to the inline processing tool (the maskless lithography system).

Next, the inline processes of block 460 and 470 are similar to the inline processes of blocks 160 and 170, respectively, of FIG. 1. Namely, maskless lithography data processing is performed to the data received from the offline tool, and subsequently a maskless lithography writing process is performed to transfer the image patterns of the IC to a wafer in accordance with the layout plan.

Figure 8:
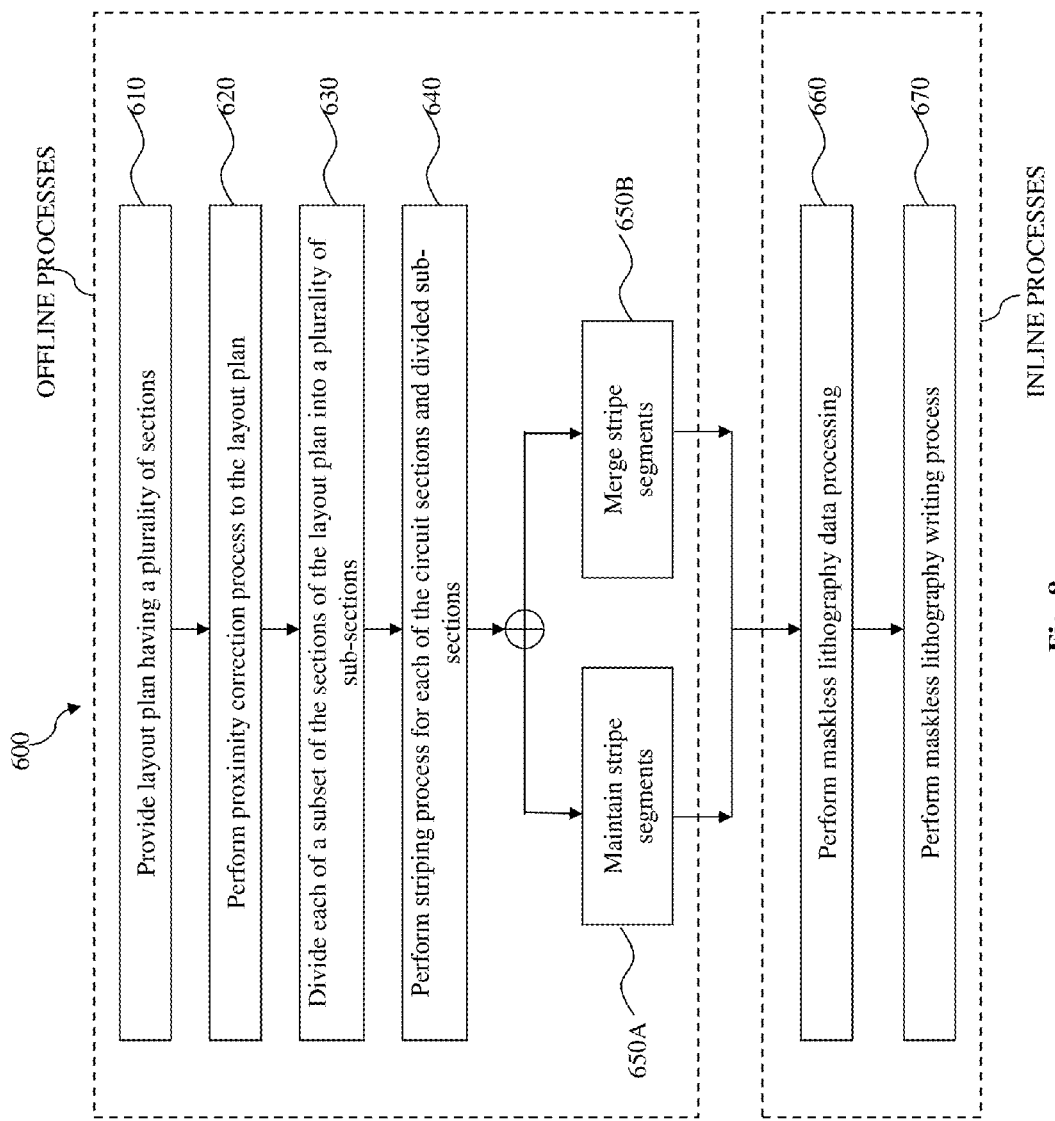
FIG. 8 is a flowchart illustrating a method of fabricating a semiconductor device according to yet another alternative embodiment of the present disclosure.

FIG. 8 is a maskless fabrication method 600 shown as a flowchart according to another alternative embodiment of the present disclosure. The method 600 includes blocks 610-670, the details of which are discussed below. In block 610, an IC layout plan is provided for an IC. For the sake of simplicity, the layout plan of FIG. 2 is used to illustrate the layout plan associated with block 610. The block 610 is substantially similar to the block 110 of FIG. 1, therefore the details of its execution are not discussed herein for the sake of simplicity.

The method 600 also includes block 620 in which a proximity correction process is performed to the layout plan. The block 620 is substantially similar to the block 120 of FIG. 1, therefore the details of its execution are not discussed herein.

Figure 9:
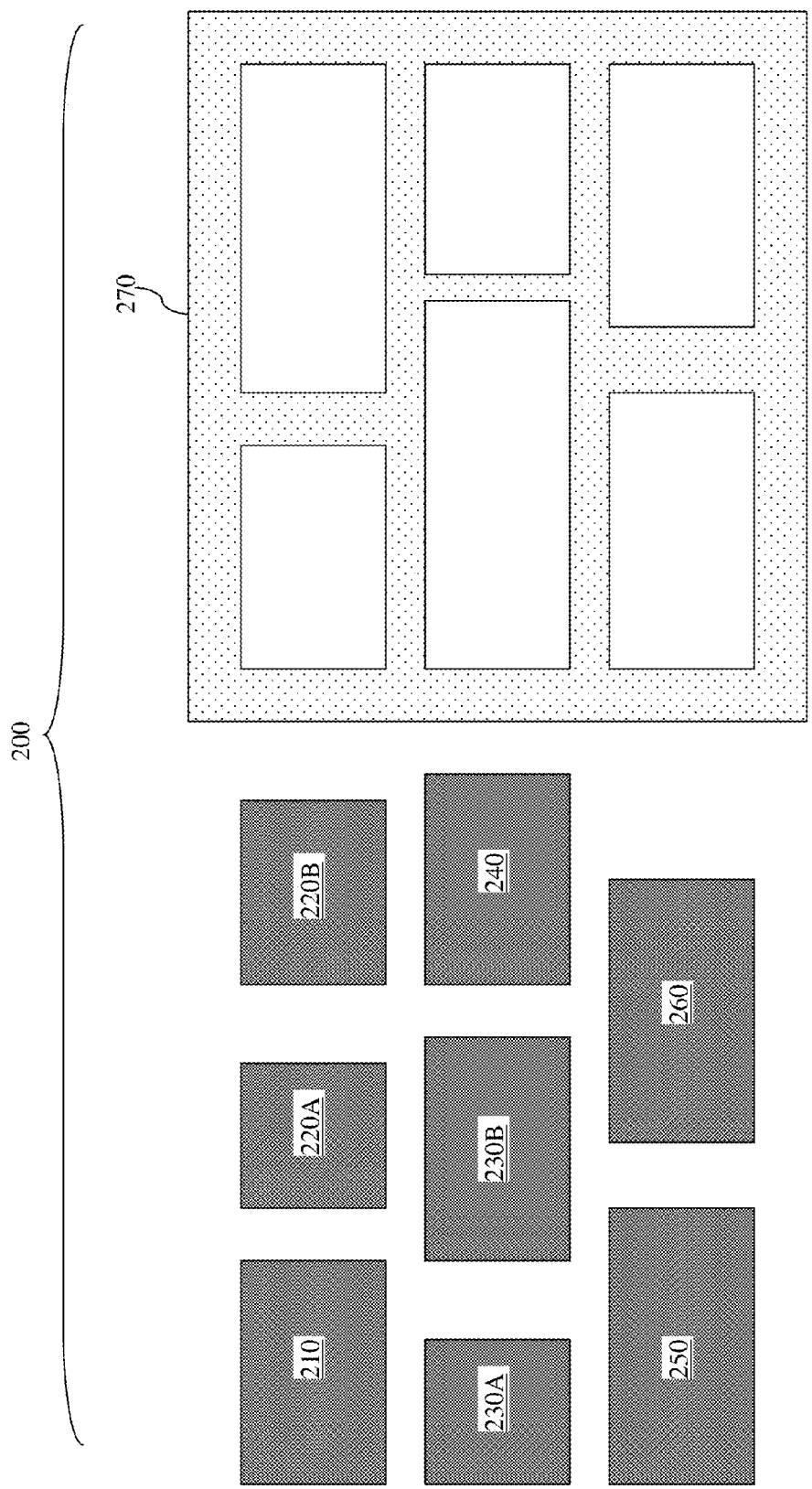
FIGS. 9-10 illustrate an IC layout plan at various stages of processing according to the embodiment of FIG. 8.

The method 600 includes block 630 in a division process is performed for a subset of the circuit sections. Each of the subset of the circuit sections is divided into a plurality of sub-sections. This is illustrated in FIG. 9, where the circuit section 220 is divided into sub-sections 220A and 220B, and the circuit section 230 is divided into sub-sections 230A and 230B. In the embodiment illustrated, the circuit sections 220 and 230 are larger in size than the rest of the circuit sections 210 and 240-260, therefore the circuit sections 220-230 are selected as candidates to be divided in the illustrated embodiment. In addition, the dividing of the circuit sections 220-230 may be based on a set of optimization criteria such as pattern densities of the circuit sections and/or device sizes of these sections. In other embodiments, other circuit sections may be selected to be divided according to alternative criteria or considerations.

Figure 10:
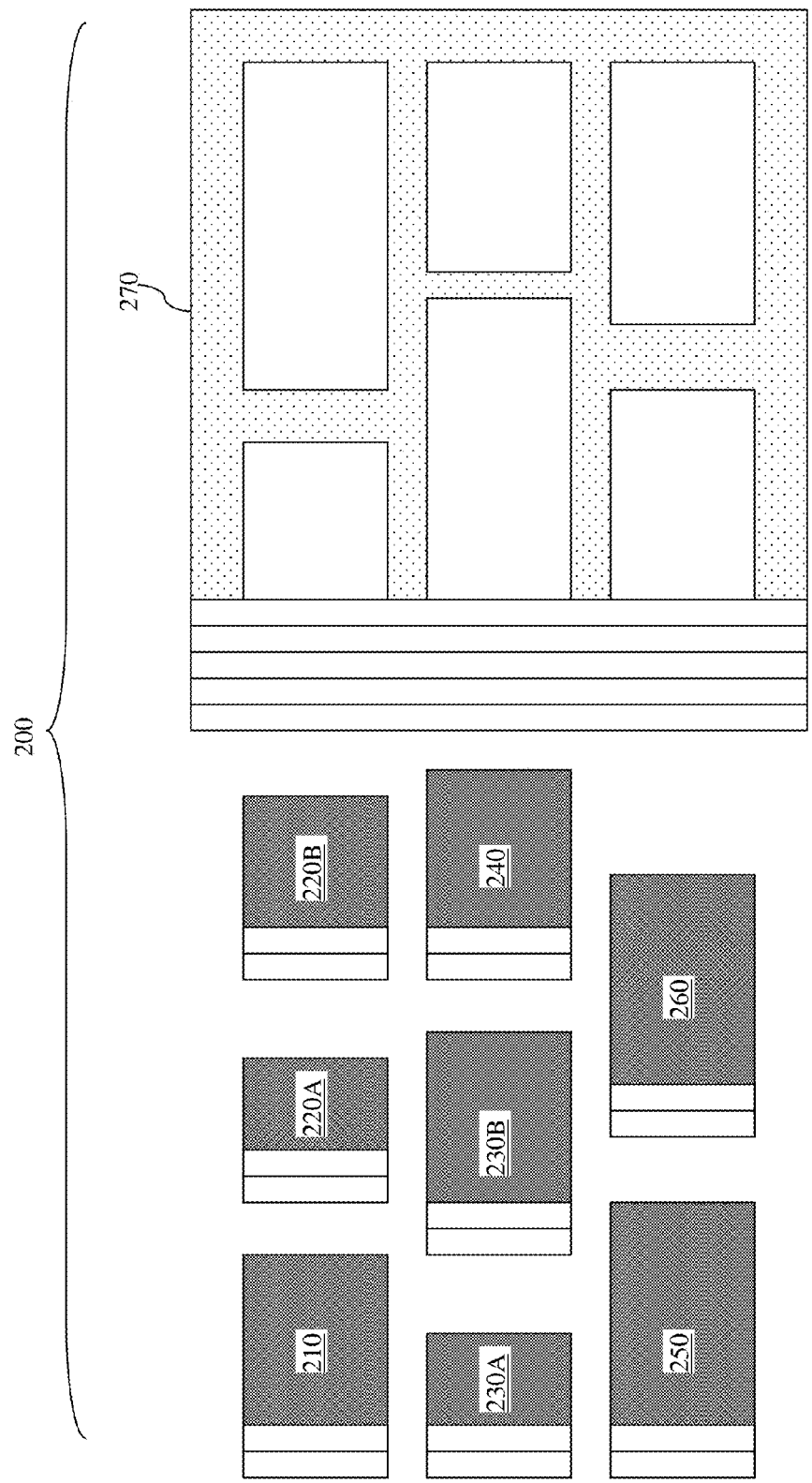

Referring back to FIG. 8, the method 600 includes block 640 in which a striping process is performed for each of the circuit sections and the divided sub-sections. This is illustrated in FIG. 10, where the circuit sections 210 and 240-270 and the divided sub-sections 220A-220B and 230A-230B each undergo a striping process. The striping process is similar to that discussed above with reference to FIG. 5. In an embodiment, the striping process for each of these circuit sections and sub-sections is handled by a different one of a plurality of data processing units or computer servers. Similar to the embodiment illustrated in FIG. 5, these computer servers work in parallel to concurrently execute the striping processes. In other words, the striping process of block 640 in FIG. 8 is a distributed process. Therefore, the striping process of block 640 also derives benefits such as shortened cycle time, less demand on the computer servers, and reduced fabrication costs.

The method 600 then either proceeds with either block 650A or block 650B. In block 650A, the stripe segments of each of the circuit sections 210-270 are maintained. Thus, no merging process is performed. In block 650B, the stripe segments of the circuit sections 210-270 are merged by stripe order of each beam. In other words, the blocks 650A and 650B represent two different embodiments, one of which maintains the stripe segments (instead of merging them), and the other of which merges the stripe segments before the data is sent to the inline processing tool (the maskless lithography system).

Next, the inline processes of block 660 and 670 are similar to the inline processes of blocks 160 and 170, respectively, of FIG. 1. Namely, maskless lithography data processing is performed to the data received from the offline tool, and subsequently a maskless lithography writing process is performed to transfer the image patterns of the IC to a substrate in accordance with the layout plan.

Figure 11:
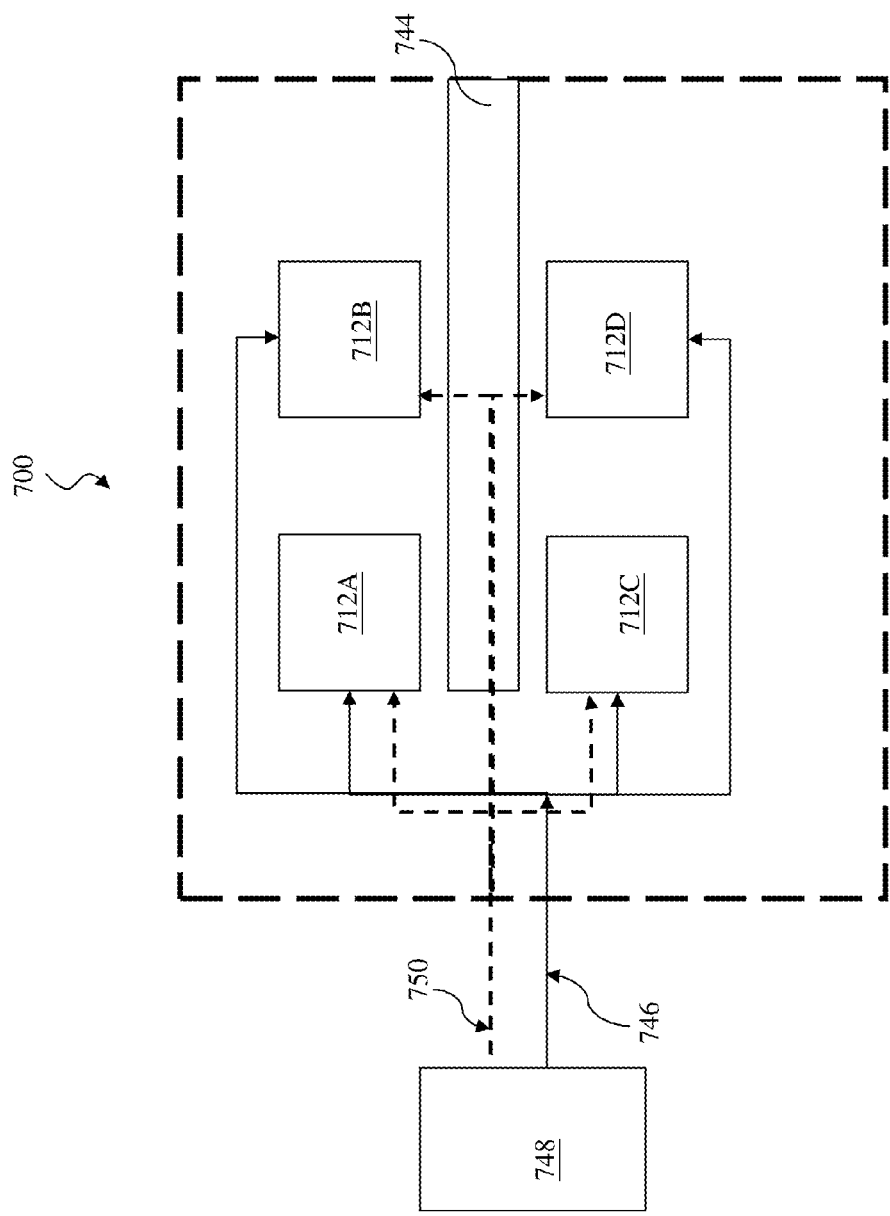
FIGS. 11-12 are simplified block diagrams of a maskless lithography system according to various aspects of the present disclosure.

FIG. 11 is a simplified block diagram of a maskless lithography apparatus according to an embodiment of the present disclosure. The lithography apparatus 700 has a plurality of writing chambers, each being designed to provide multiple radiation beams, and a circuit data path to provide circuit pattern data to each of the writing chambers, as discussed in greater detail below.

The maskless lithography apparatus 700 includes a plurality of writing chambers (scanning or patterning chambers) 712 to pattern wafers. In the illustrated embodiment, the maskless lithography apparatus 700 includes writing chambers 712A, 712B, 712C, and 712D that are integrated together. The writing chambers 712A-D are substantially identical to one another in terms of structure and is further described with reference to FIG. 12.

Figure 12:
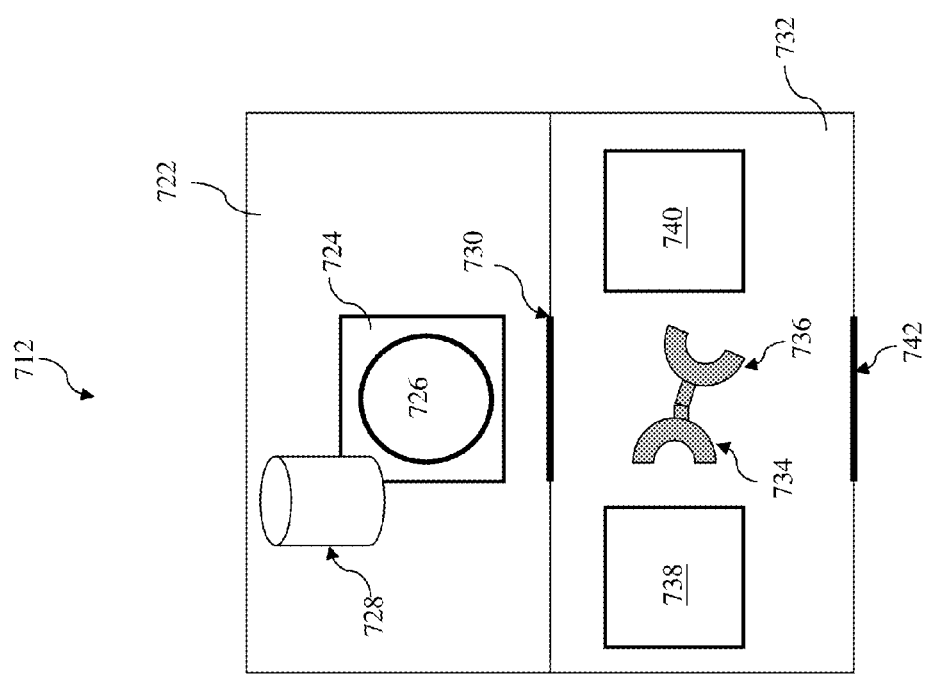
Figure 13:
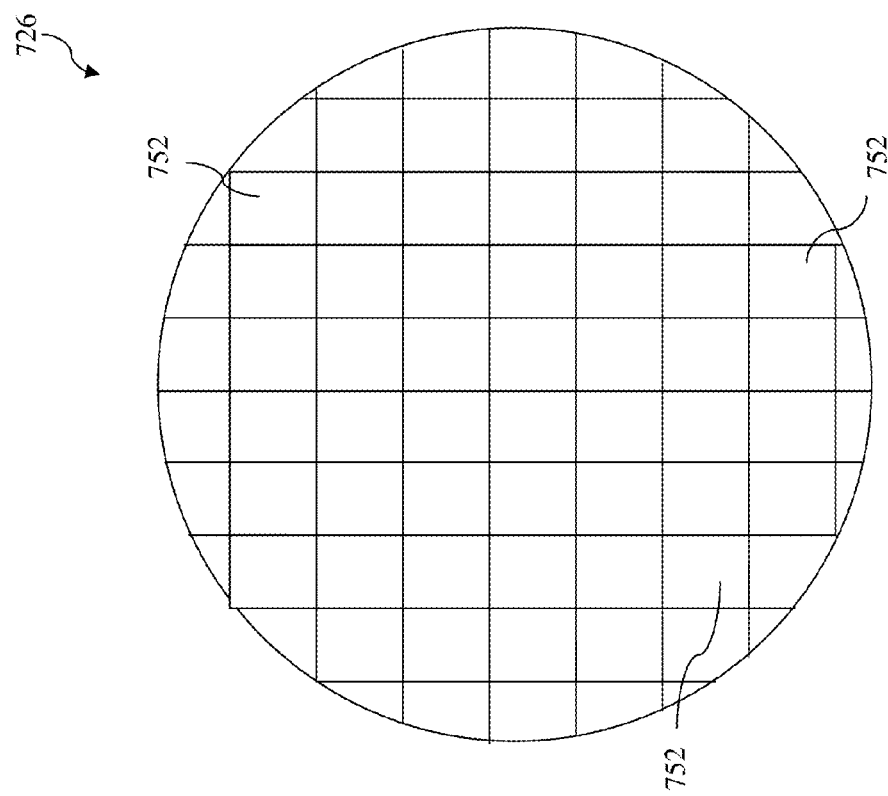
FIG. 13 is a simplified top view of a substrate undergoing a maskless lithography process.

Referring to FIG. 12, the writing chamber 712 includes a main (vacuum) chamber 722 for patterning (or writing). The main chamber 722 has a wafer stage 724 that is operable to secure and manipulate a substrate (or a wafer) 726 during the patterning process. The wafer is coated with an imaging layer sensitive to radiation energy. In one embodiment, the radiation energy includes an electron beam. The main chamber 722 may further include various vacuum pumps (not illustrated herein) to maintain the main vacuum chamber in a certain low pressure level for the writing process.

The main chamber 722 includes a multi-beam module 728 to provide multiple radiation beams to write the wafer 726. For example, the multiple radiation beams are directed to different regions (fields) of the wafer 726 such that each radiation beam is operable to write a desired pattern to a field of the wafer. In one embodiment, the multi-beam module 728 includes a multi-column cell having multiple columns integrated together. For example, the multi-column cell includes a set of micro-columns configured and spaced to be operable for simultaneously writing multiple beams to the wafer. Each column of the multi-column cell may include a source to supply the radiation energy (energy beam).

As noted earlier, the radiation energy includes an electron beam (e-beam) in one embodiment. For example, the electron beam source includes an electron gun of thermionic type or field emission type. Each column also includes a condenser lens system to redistribute the electron beam from the source. Each column also includes a scan deflector, such as an electrostatic deflector, to control the scan in a scanning mode either raster scan or vector scan. Each column also includes an objector lens, such as electromagnetic poles and/or electrostatic feature, to project the electron beam to the wafer. The multiple columns may share one electron source integrated to provide multiple electron beams. Alternatively, the multi-beam module 728 may include a single column operable to control multiple electron beams for the scan. For example, the single column is configured to direct the multiple electron beams to different fields and control the multiple electron beams for scanning in a synchronization mode.

The main chamber 722 may be additionally configured with various sensors (not shown), such as alignment sensors to monitor and assist with alignment and/or leveling sensors to monitor the leveling. The main chamber 722 also includes a gate 730 to a load lock chamber (or loadlock) 732 of the writing chamber 712 for wafer transferring. The loadlock 732 includes a robot to send a wafer to the main chamber through the gate 730 and/or receive a wafer from the main chamber through the gate 730. In another embodiment, the loadlock 732 includes two wafer handling robots 734 and 736 for efficient wafer transferring. The loadlock 732 may also include a wafer stage for pre-alignment. The loadlock may further include one or more sensors, such as pre-alignment sensor(s), to assist the process of the wafer pre-alignment. In another embodiment, the loadlock 732 includes two wafer stages 738 and 740 properly configured for efficient wafer transferring. The loadlock 732 further includes a second gate 742 to receive a wafer for writing or send a wafer out after the writing. The loadlock may also include one or more pumps configured to maintain the pressure of the loadlock chamber at a proper level.

According to various embodiments, the radiation energy may alternatively include an ion beam, an ultra-violet (UV) beam, or an extreme ultra-violet (EUV) beam. The wafer 726, to be patterned, may be a semiconductor wafer having silicon, germanium, diamond, or a compound semiconductor. Alternatively, it can be other type substrate such as glass for thin-film transistor liquid crystal display (TFT_LCD) devices or fused silicon/calcium fluoride for photomask.

The wafer 726 may include a plurality of layers formed thereon, each having patterned structures. The wafer 726 is coated with an imaging layer sensitive to the radiation energy used in the patterning process. For example, the imaging layer is sensitive to electron beam, ion beam, UV beam, or EUV beam. In an example illustrated in FIG. 3, the wafer 726 includes a plurality of regions (fields) 752. The circuit pattern provided in the set of the circuit pattern data (a circuit data file or a writing data file) can be written to each of the fields by implementing the multiple beams and the set of circuit pattern data from the data path. The multiple beams are controlled to simultaneously write the circuit pattern to multiple fields. In one example, a field size is about 26 millimeters (mm)×33 mm or less.

Referring back to FIG. 11, the maskless lithography apparatus 700 includes an interface 744 designed as an interface between the plurality of writing chambers 712 and a track unit (not shown) coupled with the maskless lithography apparatus. The track unit is designed for implementing various processes to a wafer and the imaging layer on the wafer. In one embodiment, the track unit is integrated with the maskless lithography apparatus for efficient wafer lithography processes.

In one example, these processes to the imaging layer and the substrate may include coating the substrate with the image layer, baking the imaging layer, and developing the imaging layer. The interface may include a main robot (not shown) operable to transfer substrates between the track unit and each of the writing chambers. In various embodiments, the maskless lithography apparatus 700 may further include a buffer space in the interface, in the track unit, or in an area between the interface and the track unit to store substrate to be transferred into or out of the maskless lithography apparatus 700.

In one embodiment, the various main chambers, loadlock chambers, and the interface may be maintained at different pressure levels. For example, the loadlock chamber may be maintained at a pressure level higher than that of the main chamber. The interface may be maintained at the atmospheric pressure. In another embodiment, the interface is maintained at a low vacuum state with a pressure higher that that of the loadlock chambers.

Still referring to FIG. 11, the maskless lithography apparatus 700 further includes a data path 746 to transfer a set of circuit pattern data from a data server 748 to the maskless lithography apparatus 700. In an embodiment, the data server 748 includes one or more computer servers used to executed the offline processes discussed above with reference to FIGS. 1, 6, and 8. In an embodiment, the data server 748 includes a non-transitory, tangible computer readable storage medium storing a computer program, wherein the computer program contains instructions that when executed, perform the methods 100, 400, and 600 discussed above.

The circuit pattern data has the information of integrated circuit pattern to be imaged on the substrate, specifically, to be formed on the imaging layer on wafers in each of the plurality of writing chambers. The data path may include proper physical features for data communication. For example, the data path 746 includes an optical fiber to implement data communication between the data server 748 and the maskless lithography apparatus 700.

Additionally, the maskless lithography apparatus 700 may include a buffer database (not shown) to store a portion of the set of circuit pattern data before it is distributed to the plurality of writing chambers 712. For example, a dynamic random access memory (DRAM) media may be used to store the circuit pattern data. The maskless lithography apparatus 700 may include a set of computing power, which can be field programmable gate-array (FPGA), graphics processing unit (GPU), central processing unit (CPU) or any other application-specific integrated circuit (ASIC) solution, to decompress, demultiplex the layout data and add in corrections for the process- and equipment-induced critical dimension (CD), overlay and stitching error in real time.

In one embodiment, the apparatus includes two sets of buffer databases, one being used for the current writing and another one is used for loading a next set of circuit pattern data. The data server 748 may be a data center, such as a computer with a data storage, to store integrated circuit design data (such as tapeout data) and to provide a proper circuit design data to the maskless lithography apparatus. The data server 748 may include a central processing unit (CPU), random access memory (RAM), and other proper modules. In another embodiment, the data server 748 includes a storage media large enough to store various pattern designs of different circuit designs.

In one embodiment, the maskless lithography apparatus 700 further includes a clock module 750 coupled to the plurality of the writing chambers and a mechanism to provide a clock signal through a clock wire to the plurality of writing chambers of the maskless lithography apparatus to synchronize the writing processes of the plurality of writing chambers and the wafer stages in the main chambers, such that the set of circuit pattern data can be written to various wafers respectively by the writing chambers and, furthermore, written to various fields of each wafer in a synchronization mode. The clock signal can be provided from the data server or alternatively provided from other proper control module integrated with or coupled with the maskless lithography apparatus 700. In one example, the clock signal can be generated by a circuit. In another example, the clock signal can be generated by a circuit based on an intrinsic frequency of quartz crystal oscillation.

In another embodiment, each writing chamber may additionally include a chamber database to store a portion of the circuit pattern data. In another embodiment, the maskless lithography apparatus 700 further includes one or more computers (not shown) integrated inside its various locations. The computer is connected to control and regulate various processing functions of the apparatus 700.

Figure 14:
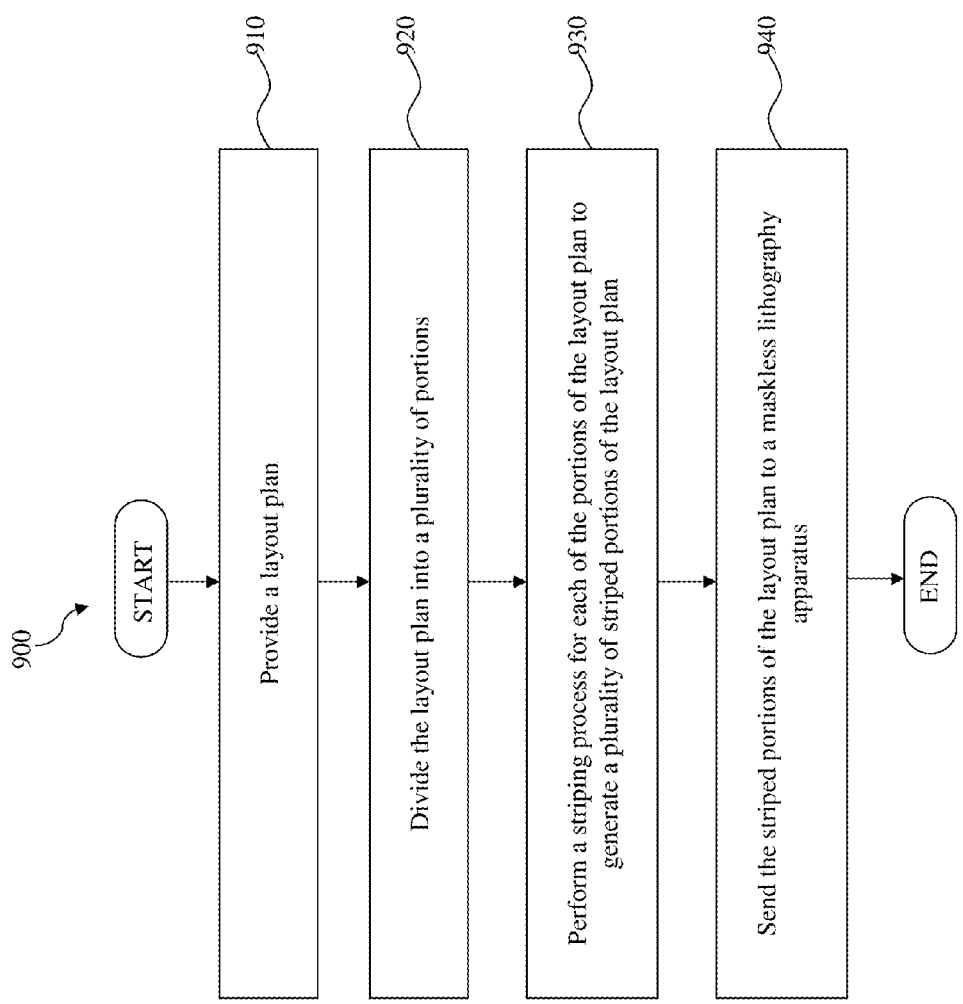
FIG. 14 is a flowchart illustrating a method of performing a maskless lithography process according to various aspects of the present disclosure.

FIG. 14 illustrates a flowchart of a method 900 for performing a maskless lithography process according to various aspects of the present disclosure. The method 900 includes block 910 in which a layout plan is provided. A proximity correction process may be performed to the layout plan. The layout plan contains a plurality of circuit sections. The method 900 includes block 920 in which the layout plan is divided into a plurality of portions. The layout plan may be divided according to a set of predefined criteria so as to optimize the dividing process. The method 900 includes block 930 in which a striping process is performed for each of the portions of the layout plan to generate a plurality of striped portions of the layout plan. The striping process for each portion of the layout plan is performed using a different one of a plurality of data processing machines that operate concurrently to carry out the striping process. The method 900 includes block 940 in which the striped portions of the layout plan are sent to a maskless lithography apparatus. The maskless lithography apparatus may include an electron beam lithography apparatus.

The various embodiments of performing a maskless lithography as discussed above offer advantages compared to conventional lithography processes, it being understood that other embodiments may offer different advantages, and that no particular advantage is required for all embodiments. One of the advantages is that the striping process can be performed more efficiently. Namely, a large layout file is split into multiple smaller files, and a striping process is performed on each of the smaller files. This also allows multiple data processing units to be used concurrently to carry out the striping process, and therefore the overall cycle time is reduced, and the data transfer bandwidth is also reduced. In embodiments where the stripes are also broken up into smaller stripe segments, the smaller stripe segments offer flexibility of strip allocation as well.

One of the broader forms of the present disclosure involves a method of fabricating a semiconductor device. The method includes: providing a layout plan; dividing the layout plan into a plurality of portions; performing a striping process for each of the portions of the layout plan to generate a plurality of striped portions of the layout plan; and sending the striped portions of the layout plan to a maskless lithography apparatus.

Another one of the broader forms of the present disclosure involves a method of performing a maskless lithography process. The method includes: receiving a computer layout file for an integrated circuit (IC) device, the layout file containing a plurality of IC sections; separating the computer layout file into a plurality of sub-files; striping the plurality of sub-files concurrently using a plurality of computer processors, thereby generating a plurality of striped sub-files; and transferring the plurality of striped sub-files to a maskless lithography system.

Yet another one of the broader forms of the present disclosure involves an apparatus comprising a non-transitory, tangible computer readable storage medium storing a computer program, wherein the computer program contains instructions that when executed, perform: providing an integrated circuit (IC) layout file, the IC layout file including a plurality of IC blocks; splitting the IC layout file into a plurality of partitions; simultaneously executing a plurality of striping processes on the partitions, wherein each partition undergoes a striping process that is executed by a different one of a plurality of computer processors; and sending the executed partitions to a maskless lithography system.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:

providing a layout plan, the layout plan containing layout information for a plurality of semiconductor features;

dividing the layout plan into a plurality of portions;

performing a striping process for each of the portions of the layout plan to generate a plurality of striped portions of the layout plan, wherein the performing the striping process is carried out in a manner such that the striping process for each portion of the layout plan is performed using a different one of a plurality of data processing machines that operate concurrently to carry out the striping process; and sending the striped portions of the layout plan to a maskless lithography apparatus capable of patterning a substrate according to the layout information for the plurality of semiconductor features of the layout plan.

2. The method of claim 1, further including, before the dividing:

performing a proximity correction process to the layout plan.

3. The method of claim 1, wherein the dividing is performed according to a set of predefined criteria so as to optimize the dividing.

4. The method of claim 1, wherein the layout plan contains a plurality of integrated circuit (IC) sections, and further including: before the dividing, merging the IC sections of the layout plan into a single file, wherein the dividing is carried out on the single file.

5. The method of claim 1, wherein the layout plan contains a plurality of integrated circuit (IC) sections, and wherein the dividing is carried out in a manner such that the plurality of portions of the layout plan each correspond to a respective one of the IC sections.

6. The method of claim 5, wherein the dividing is carried out in a manner such that: at least a subset of the IC sections are further divided into two or more portions of the layout plan.

7. The method of claim 1, further including: merging the plurality of striped portions of the layout plan into a single merged file, wherein the sending includes sending the single merged file to the maskless lithography apparatus.

8. The method of claim 1, wherein the maskless lithography apparatus includes an electron beam lithography machine.

9. The method of claim 1, further including: performing a maskless lithography process to a substrate based on the striped portions of the layout plan.

10. The method of claim 1, wherein the set of predefined criteria includes a pattern density profile of the layout plan, and wherein the dividing is performed so that a first portion having a first pattern density is smaller than a second portion having a second pattern density, the first pattern density being greater than the second pattern density.

11. A method of performing a maskless lithography process, comprising:

receiving a computer layout file for an integrated circuit (IC) device, the layout file containing layout information for a plurality of IC sections;

separating the computer layout file into a plurality of sub-files, wherein each sub-file includes a plurality of layers;

striping the plurality of sub-files concurrently using a plurality of computer processors, thereby generating a plurality of striped sub-files, wherein the striping is carried out in a manner such that each of the sub-files is striped by a different one of the computer processors; and transferring the plurality of striped sub-files to a maskless lithography system configured to pattern a wafer according to the layout information for the plurality of IC sections.

12. The method of claim 11, further including:

before the separating: performing a proximity correction process to the computer layout file; and after the transferring: performing a maskless lithography process using the maskless lithography system.

13. The method of claim 11, wherein the maskless lithography system includes one or more electron beam lithography machines.

14. The method of claim 11, wherein the separating is carried out in a manner such that each of the IC sections is separated into one or more of the sub-files.

15. The method of claim 11, wherein the separating includes separating the computer layout file in response to a list of factors selected from the group consisting of:

pattern density distribution of the computer layout file and a respective size of each of the IC sections.

16. The method of claim 15, wherein the separating is performed such that a pattern density is inversely correlated with a size for each of the plurality of sub-files.

17. An apparatus comprising a non-transitory, tangible computer readable storage medium storing a computer program, wherein the computer program contains instructions that when executed, perform:

providing an integrated circuit (IC) layout file, the IC layout file including a plurality of IC blocks;

splitting the IC layout file into a plurality of partitions;

simultaneously executing a plurality of striping processes on the partitions, wherein each partition undergoes a striping process that is executed by a different one of a plurality of computer processors; and sending the executed partitions to a maskless lithography system.

18. The apparatus of claim 17, wherein the computer program contains instructions that when executed, further perform:

performing a proximity correction process to the IC layout file; and performing a merging process to one of: the IC layout file and the plurality of partitions.

19. The apparatus of claim 17, wherein the maskless lithography system includes one or more electron beam lithography machines.

20. The apparatus of claim 17, wherein the splitting is performed in a manner such that each of the IC blocks corresponds to one or more of the partitions, and wherein the splitting is performed according to a set of predefined optimization criteria.

* * * * *

UNITED STATES PATENT AND TRADEMARK OFFICE
CERTIFICATE OF CORRECTION

PATENT NO. : 8,473,877 B2
APPLICATION NO. : 13/225617
DATED : June 25, 2013
INVENTOR(S) : Hung-Chun Wang et al.

It is certified that error appears in the above-identified patent and that said Letters Patent is hereby corrected as shown below:

Title Page, (73) Assignee: change "Taiwan Semiconductor Manufacturing Company, Ltd.;

Haynes and Boone, LLP" to "Taiwan Semiconductor Manufacturing Company, Ltd."

Signed and Sealed this
Twenty-third Day of December, 2014

Michelle K. Lee
*Deputy Director of the United States Patent and Trademark Office*